United States Patent [19]

Auld

[11] 4,150,346

[45] Apr. 17, 1979

[54] ACOUSTIC PERIODIC STRUCTURE

[75] Inventor: Bertram A. Auld, Menlo Park, Calif.

[73] Assignee: The United States of America as represented by the Secretary of the Navy, Washington, D.C.

[21] Appl. No.: 849,910

[22] Filed: Nov. 9, 1977

[51] Int. Cl.² .................. H03H 9/04; H03H 9/20; H03H 9/32; H03B 5/32

[52] U.S. Cl. .................. 333/189; 310/313; 331/107 A; 333/150

[58] Field of Search .......... 333/72, 71, 30 R, 30 M; 310/313; 330/5.5; 29/25.35, 594; 331/107 A

[56] References Cited

U.S. PATENT DOCUMENTS 3,862,431   1/1975   Quate et al. .................. 330/5.5 X

OTHER PUBLICATIONS

Auld et al. —"Horizontal Shear Surface Waves on Corrugated Surfaces" in Electronics Letters, 25 Nov. 1976, vol. 12, No. 24; pp. 650–652.

*Primary Examiner*—Alfred E. Smith
*Assistant Examiner*—Marvin Nussbaum
*Attorney, Agent, or Firm*—R. S. Sciascia; Charles D. B. Curry; Francis I. Gray

[57] ABSTRACT

An acoustic periodic structure for slow wave propagation and filtering having a corrugated surface with traction-free boundaries which can support a horizontally polarized shear surface wave that travels much slower than the bulk shear wave velocity and that exhibits an upper cut-off frequency. Electrodes are located on the tops of the teeth forming the corrugated surface and alternate electrodes are excited out of phase, the distribution of the excitation voltage phases determining the particular mode of resonance.

17 Claims, 5 Drawing Figures

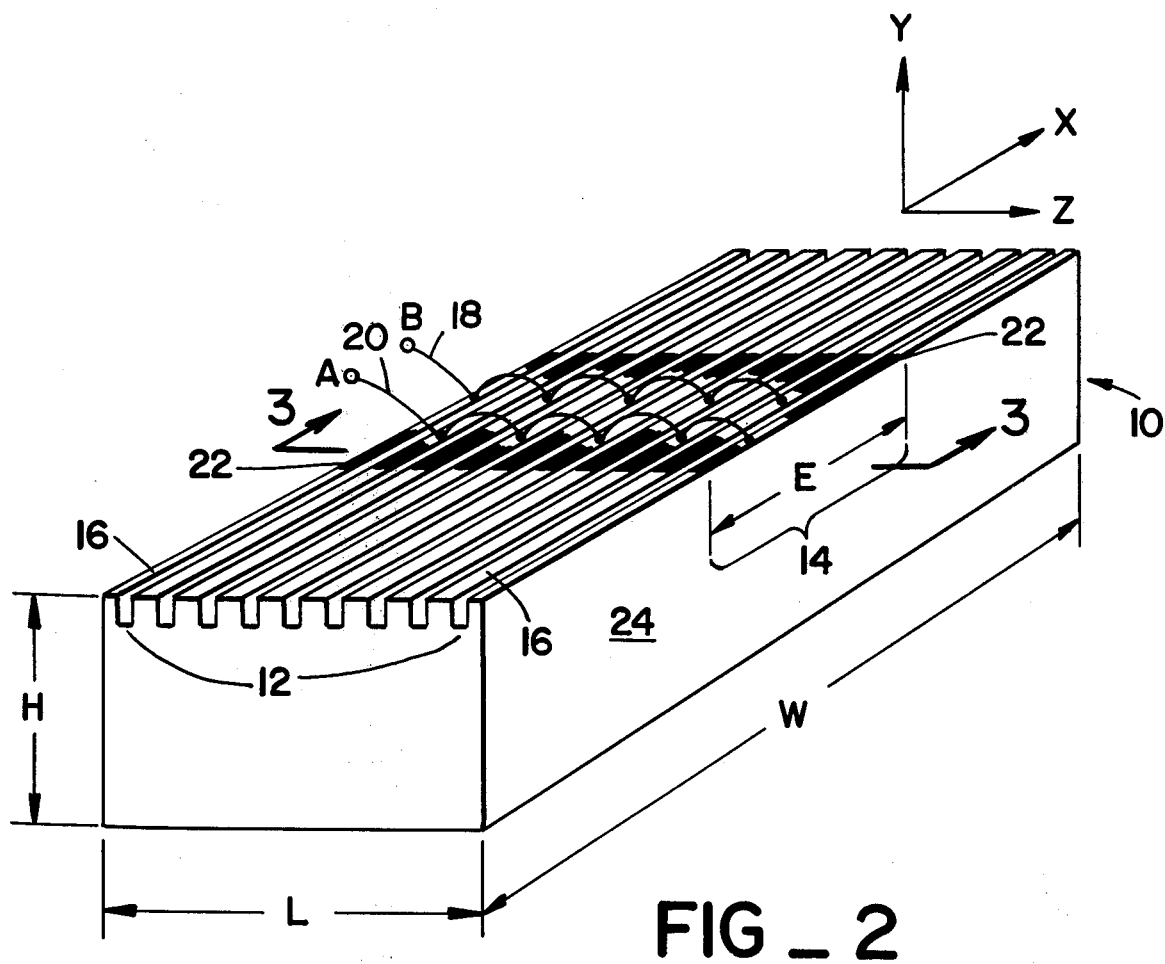
FIG _ 2
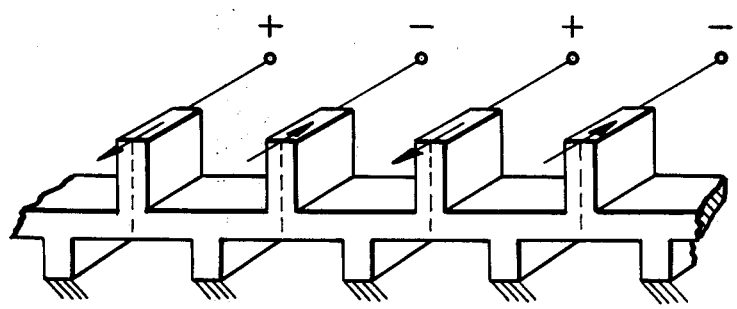
FIG _ 1

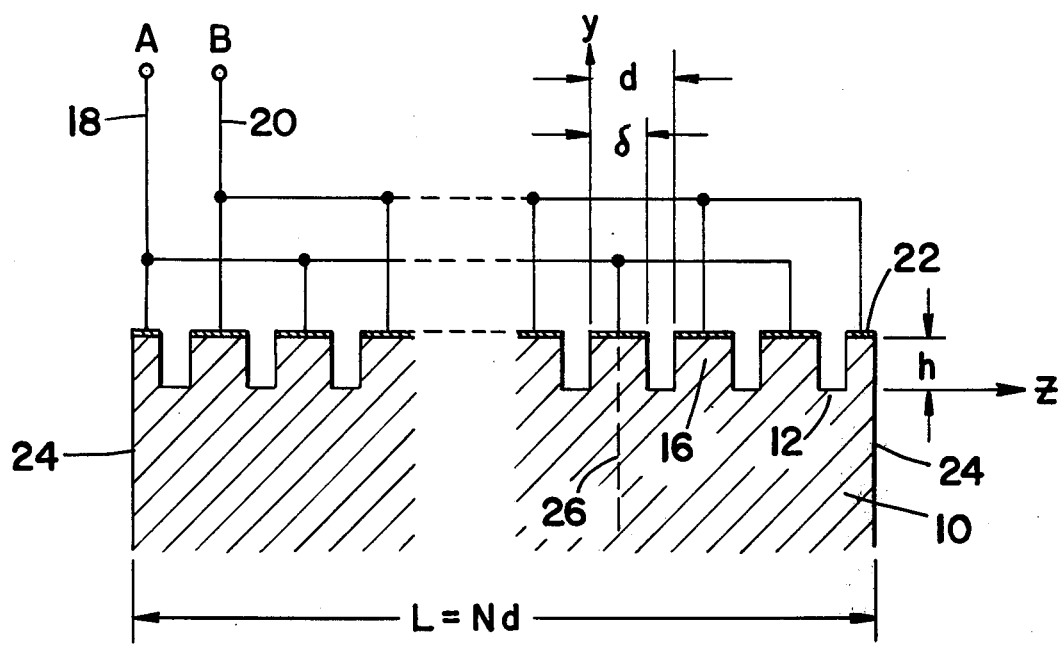
FIG_3
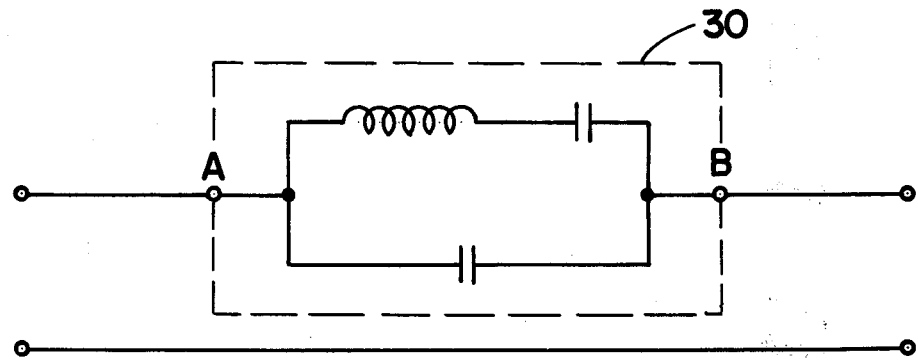
FIG_4a
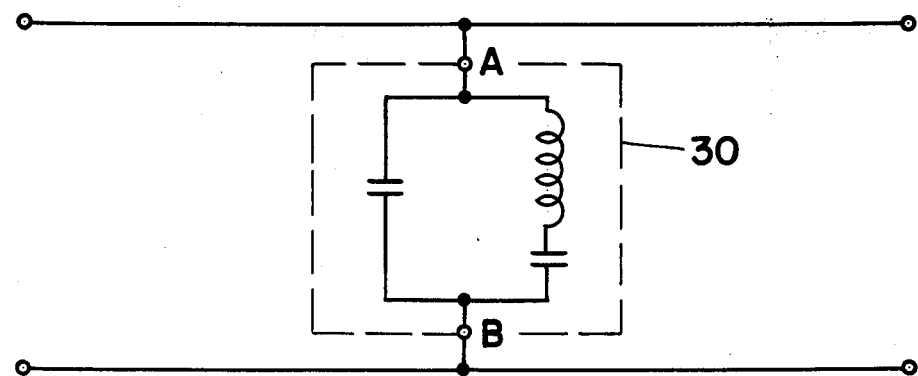
FIG_4b

ACOUSTIC PERIODIC STRUCTURE

BACKGROUND OF THE INVENTION

1. Field of the Invention

The present invention relates to surface acoustic wave devices, and more particularly to an acoustic periodic structure having a corrugated surface capable of supporting a horizontally polarized shear surface wave.

2. Background of the Invention

The attractions of surface acoustic wave (SAW) components for use in oscillators and frequency filters have been reported extensively since 1974. SAW devices are useful over the range 10 to 1000 MHz, although below 100 MHz SAW devices become inconveniently large. This is because SAW devices require long grating reflectors having 400–500 or more elements spaced $\lambda/2$ apart.

By using the analogy between Maxwell's equations, applied to the propagation of a TM-surface wave along an infinite corrugated surface, and the acoustic field equations, a new type of horizontal shear surface wave is represented. (See Auld et al, "Horizontal Shear Surface Waves on Corrugated Surfaces," Electronics Letters Vol. 12, No. 24, pg 650 Nov. 25, 1976). The acoustic variable analogous to $H_x$ is the x component of particle displacement velocity which satisfies the ordinary wave equation in two-dimensional isotropic problems. At traction-free boundaries parallel to the x-axis the normal derivative of $V_x$ is required to be zero. This shows that the electromagnetic problem of propagation of a TM-type surface wave along an infinite corrugated surface has an exact acoustic analog to a free isotropic elastic plate with a uniform grating of slots cut into the upper surface.

Although most surface acoustic wave research has been concerned with Rayleigh waves, horizontally polarized surface waves are not unknown. Such waves exist on piezoelectric and magnetostrictive substrates, and also on layered isotropic substrates (Love waves). The waves considered here are unique, however, in that they have a propagation velocity much slower than the bulk shear wave velocity and exhibit an upper cut-off frequency. At this point the period of the grating may be significantly less than $\lambda_{shear}/2$.

SUMMARY OF THE INVENTION

Accordingly, the invention provides a free isotropic elastic plate substrate with a plurality of parallel slots on the upper surface. Means are provided for propagating a horizontally polarized shear surface wave across the grating formed by the slots. The propagation boundaries of the substrate are traction-free. Excitation of alternate teeth out of phase determines the mode of resonance according to the distribution of the excitation voltage phases.

Therefore, it is an object of the present invention to provide an acoustic periodic structure which uses a horizontally polarized shear surface wave.

Another object of the present invention is to provide an acoustic resonator much smaller than prior SAW resonators.

Other objects and novel features of the present invention will be apparent from the following detailed description when read in conjunction with the appended claims and attached drawings.

BRIEF DESCRIPTION OF THE DRAWING

FIG. 1 is a perspective view of an analogous tuning fork "grating" resonator.

FIG. 2 is a perspective view of a shear surface wave grating resonator according to the present invention for the case in which alternate teeth are excited 180° out of phase.

FIG. 3 is a partial cross-sectional view of the shear surface wave grating resonator of FIG. 2 taken along the line 3—3.

FIG. 4 is an equivalent circuit representation of the shear surface wave grating resonator as (a) a frequency control element for an oscillator, and (b) as a simple one pole filter.

DESCRIPTION OF THE PREFERRED EMBODIMENT

One way of picturing a horizontally polarized shear (SH) surface wave is to imagine it as evolving from the stacking of a number of standard tuning fork resonators in which the arms move in face shear in an array as shown by the arrows in FIG. 1. The dashed lines are traction-free surfaces. The basic SH grating evolves from this as the dimension is extended to infinity along the particle displacement direction, x, and the individual supports are replaced by a continuous substrate.

Referring now to FIGS. 2 and 3 a free isotropic elastic plate substrate 10 having height H, length L and width W has a uniform grating of narrow, shallow slots cut into the upper surface across the width of the substrate to produce an acoustic periodic structure. The slots may be cut with a diamond saw, maybe orientation dependent etched, or maybe manufactured by other suitable means. The top surface and reflecting boundaries are polished. An electroded region 14 of width E is deposited on the surface of the teeth 16, defined by the slots 12, by means well known in the art. The width E is large enough to eliminate edge effects. Leads 18, 20, preferably of gold wire, are attached to alternate electrodes 22 by suitable means. A voltage is applied at terminals A and B of leads 18, 20 to produce a phase shift from one electrode 22 to the next of $\pi$ ($\pi$-mode), particle displacement is as shown for the tuning fork grating resonator of FIG. 1.

The grating structure on the substrate is terminated at each boundary 24 in a pair of mirror reflectors which are located at a suitable traction-free boundary. In the case of the $\pi$-mode shown where the particle displacement is along x and varies with y and z, the displacement $U_x$ is maximum with respect to the z variation at the plane 26 denoted by a dashed line in FIG. 3. This means that the strain component $S_{xz}$ and the stress component $T_{xz}$ are zero on this plane. Since $U_x$ is a function only of y and z, the stress components $T_{yz}$ and $T_{zz}$ are also zero — just the conditions required for a traction-free boundary which acts as a perfect mirror. By further symmetry arguments one can show that the same boundary conditions act as a perfect mirror for a surface wave with any wave number K.

The resonance condition is that the length L be an integral number n of half wavelengths, or that $K = n\pi/Nd$ where N is the number of sections of length d. For a 10-section resonator there are therefore ten modes of resonance with frequencies determined from a dispersion diagram which is a function of the depth h of the slots 12. A particular mode may be excited by applying the corresponding distribution of voltages to the electrodes 22 located on the surfaces of the teeth 16 via individual leads to each electrode. As illustrated the SH grating resonator is configured in the $\pi$-mode as in a conventional interdigital transducer.

The frequency of the $\pi$-mode corresponds to the lower edge of the stop band. Above this frequency the SH surface wave is nonpropagating (or cut-off). The cut-off frequency also is strongly dependent on the slot depth h. Nonuniform groove depth therefore causes different parts of the grating to resonate at different frequencies. Thus, the resonance can be confined to a desired region of the surface of the substrate 10 by deliberately tailoring the depth profile of the slots 12. This effect may be achieved as a result of the mass loading by the electrodes 22 which effectively increases the depth of the slots under the electrodes.

In FIGS. 4a and 4b the $\pi$-mode SH grating resonator is represented by an equivalent circuit 30. The resonator 30 may be connected serially as a frequency control element for an oscillator or in transmission, or may be connected in parallel as a simple one pole filter. Since the SH grating resonator uses traction-free boundaries as mirrors where a SAW resonator requires two gratings to act as mirrors, the SH grating resonator is much smaller by a factor of 5-10 than an equivalent SAW device. Also the element spacing for an SH grating resonator is less than $\lambda/2$, and may be of the order of $\lambda/5$.

Because polarization of the surface wave is SH, there is no scattering from the surface mode into thickness modes at the reflector faces 24 of the resonator, contrary to the case of Rayleigh surface wave reflections. The SH surface wave also is intimately related to the surface skimming bulk waves (SSBW) reported by Browning et al at the 31st Frequency Control Symposium in Atlantic City in June, 1977. The SSBW consists of a horizontally polarized shear elastic vibration skimming along the surface and slowly diffracting into the substrate. The addition of the slots 12 of the present invention traps the SH wave at the surface. If the electrode array is suitably designed to synchronize with the SH surface wave, as in the case of a Rayleigh transducer, there is essentially no diffraction loss into the substrate.

EXAMPLES

1. An aluminum plate with 6 mil slots had PZT-5A thickness shear input and output transducers affixed with DOW Resin 276-V9 at the traction-free boundaries. Using a frequency synthesizer, surface wave resonances were observed at frequencies where the grating was an integral number of wavelengths long.

2. A PZT-8 ceramic resonator on a phenolic base with L=0.475", H=0.475", W=3" and E=1" had 19 sections (teeth) with a slot depth of 0.01". Resonance in the $\pi$-mode was obtained at 1.1325 MHz with a Q of approximately 200.

3. A Y-cut and X-propagating lithium niobate (LiNbO$_3$) resonator was made with the top surface y-oriented and 17 slots along z with dimensions of L=0.425", H=0.2", W=2.125" and E=0.625". After glueing the ends of the LiNbO$_3$ block onto lucite supports to suppress spurious bulk modes, a strong $\pi$-mode SH surface wave resonance was observed at approximately 2.3 MHz with a Q of not more than 2000. The slot depth was 0.01".

4. An unmounted 39.3° ST quartz plate with L=0.5", H=0.08", W=1.0" and E=0.5" had 0.01" slots cut along the x direction. Resonance in the $\pi$-mode was observed at approximately 1.976 MHz with Q on the order of 3000.

Since a sufficient condition for the existence of the SH surface wave is a periodicity of the conditions along the surface, another technique for trapping the wave at the surface is the deposition of an array of metal strips as opposed to cutting slots.

Thus, the present invention provides an acoustic resonator having a periodic structure with traction-free boundaries which is much smaller than standard SAW devices and which exhibits a definite upper cut-off frequency. Potential applications include the areas of compact long delay lines, grating filters and frequency control devices, to name but a few.

What is claimed is:
1. An acoustic device comprising:
   (a) a substrate having a periodic structure upon the upper surface with traction-free boundaries at the ends of said substrate; and
   (b) means for exciting a horizontally polarized shear surface wave which propagates across said periodic structure between said traction-free boundaries.
2. An acoustic device as recited in claim 1 wherein said periodic structure comprises a uniform grating cut into the upper surface of said substrate.
3. An acoustic device as recited in claim 2 wherein said exciting means comprises an array of transducer electrodes, one of said transducer electrodes being deposited on top of each tooth of said uniform grating.
4. An acoustic device as recited in claim 3 wherein said exciting means further comprises means for selecting the distribution of voltage phases applied to said transducer electrode array to excite an individual resonant mode of said acoustic device.
5. An acoustic device as recited in claim 4 wherein said substrate comprises a free isotropic elastic plate.
6. An acoustic device as recited in claim 4 wherein said substrate comprises a piezoelectric material.
7. An acoustic device as recited in claim 2 wherein said exciting means comprises an acoustic transducer attached to one of said traction boundaries.
8. An acoustic device as recited in claim 7 wherein said substrate comprises a free isotropic elastic plate.
9. An acoustic device as recited in claim 7 wherein said substrate comprises a piezoelectric material.
10. An acoustic device as recited in claim 1 wherein said periodic structure comprises a uniform array of metal strips deposited on the upper surface of said substrate.
11. An acoustic device as recited in claim 10 wherein said exciting means comprises an array of transducer electrodes, one of said transducer electrodes being deposited on top of each tooth of said uniform grating.
12. An acoustic device as recited in claim 11 wherein said exciting means further comprises means for selecting the distribution of voltage phases applied said transducer electrode array to excite an individual resonant mode of said acoustic device.
13. An acoustic device as recited in claim 12 wherein said substrate comprises a piezoelectric material.
14. An acoustic device as recited in claim 12 wherein said substrate comprises a free isotropic elastic plate.
15. An acoustic device as recited in claim 10 wherein said exciting means comprises an acoustic transducer attached to one of said traction boundaries.
16. An acoustic device as recited in claim 15 wherein said substrate comprises a piezoelectric material.
17. An acoustic device as recited in claim 15 wherein said substrate comprises a free isotropic elastic plate.

* * * * *